United States Patent
Kaler (10) Patent No.: US 7,596,657 B2
(45) Date of Patent: Sep. 29, 2009

(54) INCREASED STORAGE CAPACITY FOR SOLID STATE DISKS USING DATA COMPRESSION

(76) Inventor: Paul Kaler, 1112A Edwards St., Houston, TX (US) 77007

( * ) Notice: Subject to any disclaimer, the term of this patent is extended or adjusted under 35 U.S.C. 154(b) by 430 days.

(21) Appl. No.: 11/652,158

(22) Filed: Jan. 10, 2007

(65) Prior Publication Data

US 2007/0168624 A1    Jul. 19, 2007

Related U.S. Application Data

(60) Provisional application No. 60/758,403, filed on Jan. 13, 2006.

(51) Int. Cl.
*G06F 13/00*    (2006.01)
(52) U.S. Cl. .................. 711/103; 711/154; 711/165
(58) Field of Classification Search ............... 711/103, 711/154, 165
See application file for complete search history.

(56) References Cited

U.S. PATENT DOCUMENTS

| | | | | |
|---|---|---|---|---|
| 5,659,704 A | * | 8/1997 | Burkes et al. | 711/114 |
| 6,145,069 A | * | 11/2000 | Dye | 711/170 |
| 7,469,329 B2 | * | 12/2008 | Kuczynski et al. | 711/170 |
| 2006/0126739 A1 | * | 6/2006 | Stoner | 375/240.16 |
| 2006/0224762 A1 | * | 10/2006 | Tian et al. | 709/231 |

* cited by examiner

*Primary Examiner*—Reba I Elmore
(74) *Attorney, Agent, or Firm*—Robert C. Strawbrich (57) ABSTRACT

The storage capacity of a solid state disk (SSD) device is increased through data compression. The SSD is coupled to a host computer system and includes a non-volatile storage module (NVSM) and a volatile memory (VM). The SSD is associated with a predetermined compression ratio of n to 1, where n is a value greater than 1. A virtual storage capacity is initially reported to the host computer system that is n times the physical storage capacity of the VM. An overflow buffer is established on the storage media of the NVSM. The currently available virtual capacity of the VM is monitored based on the current compression ratio and the amount of data currently stored therein. Data is stored to the overflow buffer whenever the available virtual capacity falls below that necessary to successfully process a pending storage operation requested by the host computer system. The data stored in the overflow buffer is populated to the VM when the amount of available virtual capacity of the VM can accommodate the data.

19 Claims, 5 Drawing Sheets

INCREASED STORAGE CAPACITY FOR SOLID STATE DISKS USING DATA COMPRESSION

This application claims the benefit of U.S. Provisional Application No. 60/758,403 filed Jan. 13, 2006 and entitled "Method for using real-time compression with SSD."

BACKGROUND

Non-volatile storage is essential to virtually all computer systems, from notebooks to desktops to large data centers employing clusters of servers. Non-volatile storage serves as a secure data repository which prevents data loss in the event of an unexpected interruption in primary power. Some common forms of non-volatile storage are packaged as non-volatile storage modules (NVSM) that can employ a magnetic disk (under control of a magnetic disk drive), flash memory components, or even magnetic tape (under control of a magnetic tape drive) as the non-volatile storage medium for the module.

One of the downsides of non-volatile storage is that it is relatively slow to access compared to volatile forms of memory such as DRAM (Dynamic Random Access Memory). Thus, virtually all computer systems also include volatile memory (VM) in which to temporarily store data for faster access. For example, code for executing application programs and data recently used by active applications are stored to and retrieved from the non-volatile storage and stored in the VM to increase execution speed. Volatile storage media such as semiconductor based DRAM, however, tends to be significantly more costly per unit of storage capacity then non-volatile memory such as magnetic disks.

Recently, a hybrid form of storage has been developed that seeks to provide the persistence of non-volatile storage but with an access speed comparable to VM. This form of storage is commonly known as a solid state disk (SSD). The SSD typically includes DRAM chips or some other form of VM and an NVSM that employs a non-volatile storage medium such as a magnetic disk, flash memory or the like. The SSD also typically includes a back-up or secondary power source such as a battery. The internal battery supply is used in the event that primary power is lost, preferably with sufficient capacity to continue refreshing the VM at least until all of the data stored therein is saved to the media of the NVSM. Once primary power is restored, the data can be retrieved from the NVSM and stored back into the VM for fast access by the host computer system to which it is coupled.

Because VM is substantially more expensive than non-volatile storage media, an SSD storage array endeavoring to provide storage capacity comparable to conventional non-volatile storage arrays becomes very costly. Thus, if the amount of data that can be stored within the volatile storage of an SSD can be significantly increased without requiring a commensurate increase in the amount of physical memory employed for the VM, a significant cost/performance advantage would be realized. One technique that has been generally employed in memory systems to increase the storage density of a fixed amount of volatile memory is to subject the data to a data compression algorithm to reduce the volume of data prior to storing the data into the VM. If the data is of a type that is susceptible to substantial compression, the amount of data that can be stored within a given amount of volatile memory such as DRAM is increased without a requisite increase in the number of physical storage components.

A memory system employing compression can report to the host system within which it is deployed a "virtual" capacity that is typically n times its specified physical capacity, where n is equal to the numerator of a predetermined compression ratio the value of which can be specified based on, for example, the type of applications typically being executed by the system. Thus, if the predetermined compression ratio specified for the VM of a memory array is 3:1, and the amount of volatile memory is physically, 1 Gigabyte for example, the memory array can report a virtual capacity of 3 Gigabytes to its host computer system.

Serious issues can arise, however, when attempting to employ compression to increase the virtual capacity of a memory system's VM. Actual compression ratios at any instant in time will vary, depending upon the type of data that is being currently stored. For example, JPEG data is not as susceptible to compression as other types of data. Thus, if it becomes necessary during operation for the memory array to store a significant amount of JPEG data to a volatile memory array that has reported a capacity value based upon a certain predetermined average compression ratio, the short-term compression ratio can suddenly fall well below the predetermined average specified for the storage device.

If such a situation persists, the virtual capacity (and thus the currently available capacity) of the volatile memory of a memory system can quickly fall substantially below that which was initially reported to the system. Under such circumstances, the memory can exceed the currently available virtual storage capacity of the VM before the host system (such as through a memory array controller) can either divert the data to an alternate storage resource or at least to notify the system to stop sending it data. This can lead to the loss of data, which is particularly unacceptable in enterprise applications that most commonly employ SSD products.

BRIEF DESCRIPTION OF THE DRAWINGS

For a detailed description of embodiments of the invention, reference will now be made to the accompanying drawings in which.

NOTATION AND NOMENCLATURE

Certain terms are used throughout the following description and in the claims to refer to particular features, apparatus, procedures, processes and actions resulting therefrom. Those skilled in the art may refer to an apparatus, procedure, process, result or a feature thereof by different names. This document does not intend to distinguish between components, procedures or results that differ in name but not function. Moreover, those of skill in the art will recognize that the procedural flow diagrams illustrating embodiments of the invention are intended solely to illustrate the general functionality of the invention are not intended to depict a strict functional sequence. For example, those of skill in the art will recognize that certain of the processes run in parallel with one another or are susceptible to being run in an order that is different than that depicted by the flow diagrams disclosed herein. Thus, the functional diagrams are only intended to communicate the general functionality of the disclosed invention and are but one possible embodiment of that functionality. Finally, in the following discussion and in the claims, the terms "including" and "comprising" are used in an openended fashion, and thus should be interpreted to mean "including, but not limited to . . . ."

DETAILED DESCRIPTION

The following discussion is directed to various embodiments of the invention. Although one or more of these embodiments may be preferred, the embodiments disclosed should not be interpreted as, or otherwise be used for limiting the scope of the disclosure, including the claims, unless otherwise expressly specified herein. For example, while embodiments disclosed herein perform "replication" and "(re)population" functions, the presence of these functions is not required for purposes of the invention. These embodiments are merely intended to describe how the invention can be implemented in the presence of such functions. In addition, one skilled in the art will understand that the following description has broad application, and the discussion of any particular embodiment is meant only to be exemplary of that embodiment, and not intended to imply that the scope of the disclosure, including the claims, is limited to that embodiment.

As previously discussed, to physically increase the amount of volatile storage capacity in an SSD would render such a device significantly more expensive. Thus, it would be advantageous to increase the storage capacity of the volatile memory of an SSD without increasing the amount of physical memory, thereby providing a significant cost/performance advantage. Heretofore, the problem with employing compression is that the compression ratio fluctuates over time, its current value depending upon the type of data to be stored at any instant in time for applications being executed by the system. As a result, there can be no guarantee that the virtual capacity of volatile memory (i.e. the capacity of the memory based on a predetermined compression ratio) that is initially reported to the system will not be exceeded. Thus, there is risk that critical data may be lost if the reported initial virtual capacity of the volatile memory is exceeded.

Embodiments of the present invention permit the reporting of a virtual capacity of the volatile memory of an SSD that exceeds its physical capacity based upon a predetermined compression ratio, while still ensuring that critical data is not lost in the event that the reported capacity is exceeded. In an embodiment, this can be accomplished by reserving an overflow buffer on the SSD's nonvolatile storage media (NVSM) and storing any overflow data to that overflow buffer should the available virtual storage capacity of the VM be exceeded. Once sufficient virtual capacity of the VM becomes available (because, for example, the current compression ratio has returned to a more advantageous value), the SSD can populate the overflow data from the overflow buffer of the NVSM back to the VM.

In another embodiment, the risk of a loss of data is prevented by periodically reporting to the host system (such as through a storage array controller) the current compression ratio and the currently available virtual capacity of the volatile memory in response to real-time changes in the compression ratio. Thus, if the host system through, for example, a storage array controller, sees that the currently available virtual capacity has become critically low, it can route data to other available alternate storage resources within the storage array (or to another memory system entirely) until the available virtual capacity of the SSD increases sufficiently (because, for example, the current compression ratio has returned to a more advantageous value). In an embodiment, the SSD can also reserve a small overflow buffer on the nonvolatile memory medium as a failsafe in the event that the array controller cannot react quickly enough to avoid an overflow situation.

Figure 1:
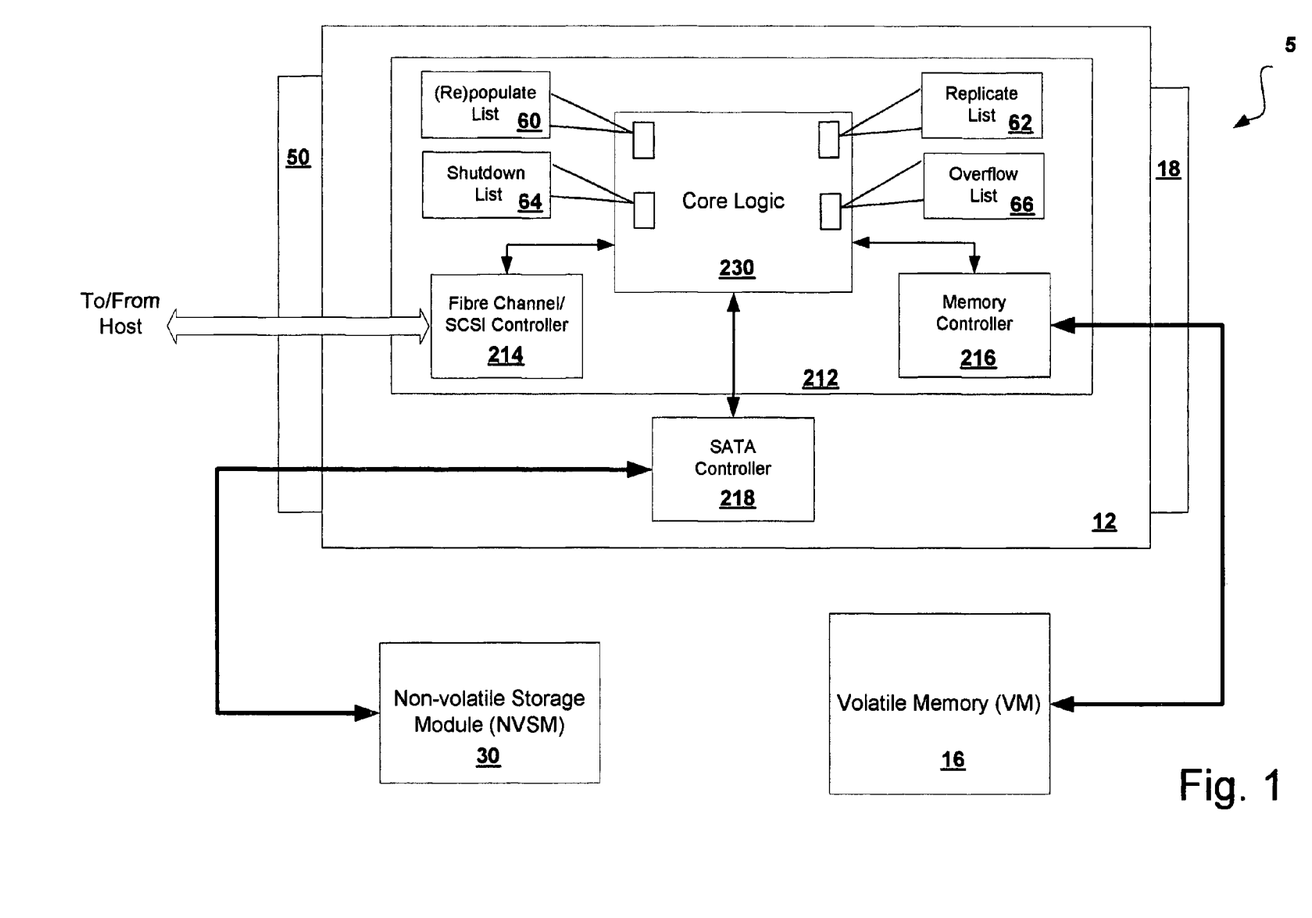
FIG. 1 is a block diagram that illustrates various features of a solid state disk (SSD), including some features by which the SSD operates in accordance with an embodiment of the present invention.

FIG. 1 is a block diagram that illustrates various features of a solid state disk (SSD) 5 that may be used to implement various embodiments of the invention. SSD 5 may be coupled to a host computer system (not shown) either directly, or indirectly through one or more intermediate devices such as a storage array controller or the like. In an embodiment, the SSD 5 includes an SSD controller 12 that comprises several components mounted on a PCB (printed circuit board). The SSD 5 further includes a non-volatile storage module (NVSM) 30 that can include a non-volatile storage medium such as a magnetic disk, flash memory, magnetic tape or the like. The controller 12 can be coupled to the host computer system and the NVSM 30 through backplane connector 50 as illustrated.

The SSD 5 can further include a volatile memory (VM) 16 that can be comprised of volatile memory media components such as SRAM (static random access memory) or dynamic random access memory (DRAM). The term DRAM should be interpreted for purposes of this disclosure to include any one of a number of DRAM variations such as SDRAM (synchronous DRAM), DDR (double data rate SDRAM), DDR2 (double data rate 2 SDRAM), and equivalents thereof. The PCB upon which the SSD controller 12 components are mounted can be coupled to the PCB upon which the VM 16 storage components are mounted through a connector such as sandwich connector 18.

An embodiment of the SSD controller 12 may further include a core logic block 230 that communicates with the host computer via a channel interface 214 that conforms to a standard channel interface such as Fibre Channel, SCSI or equivalent. Those of skill in the art will recognize that if the SSD 5 is configured as part of a group of memory devices, it may also communicate with a storage array controller that coordinates storage among the group on behalf of the host computer. Core logic 230 may also communicate with the storage media of NVSM 30 through an interface controller 218 that implements a standard such as SATA or an equivalent thereof appropriate to the type of media employed within the NVSM 30. Core logic 230 can also communicate with the VM 16 through a memory controller 216. Core logic 230 can be implemented in the form of an FPGA (field programmable gate array), ASIC (application specific integrated circuit) or some other equivalent integrated circuit 212 technology.

In an embodiment, the core logic 230 can be implemented as a microcontroller that includes a processor that executes firmware stored in a small non-volatile memory by which to control the functioning of the SSD 5, or as a sequential state machine or some other form of sequential combinatorial logic. Those of skill in the art will recognize that the controllers 214, 216 and 218 can also be incorporated within the same integrated circuit 212 as the core logic 230, or can be implemented using any other physical partitioning of the functions as may be deemed preferable. The SSD 5 also includes a secondary or back-up power source, which is typically a battery (not shown). The secondary power source is typically engaged to supply power for certain tasks required to ensure an orderly shut-down during a loss of primary power. While primary power is present, the battery can be maintained substantially at full capacity by charging it using the primary power.

Figure 2:
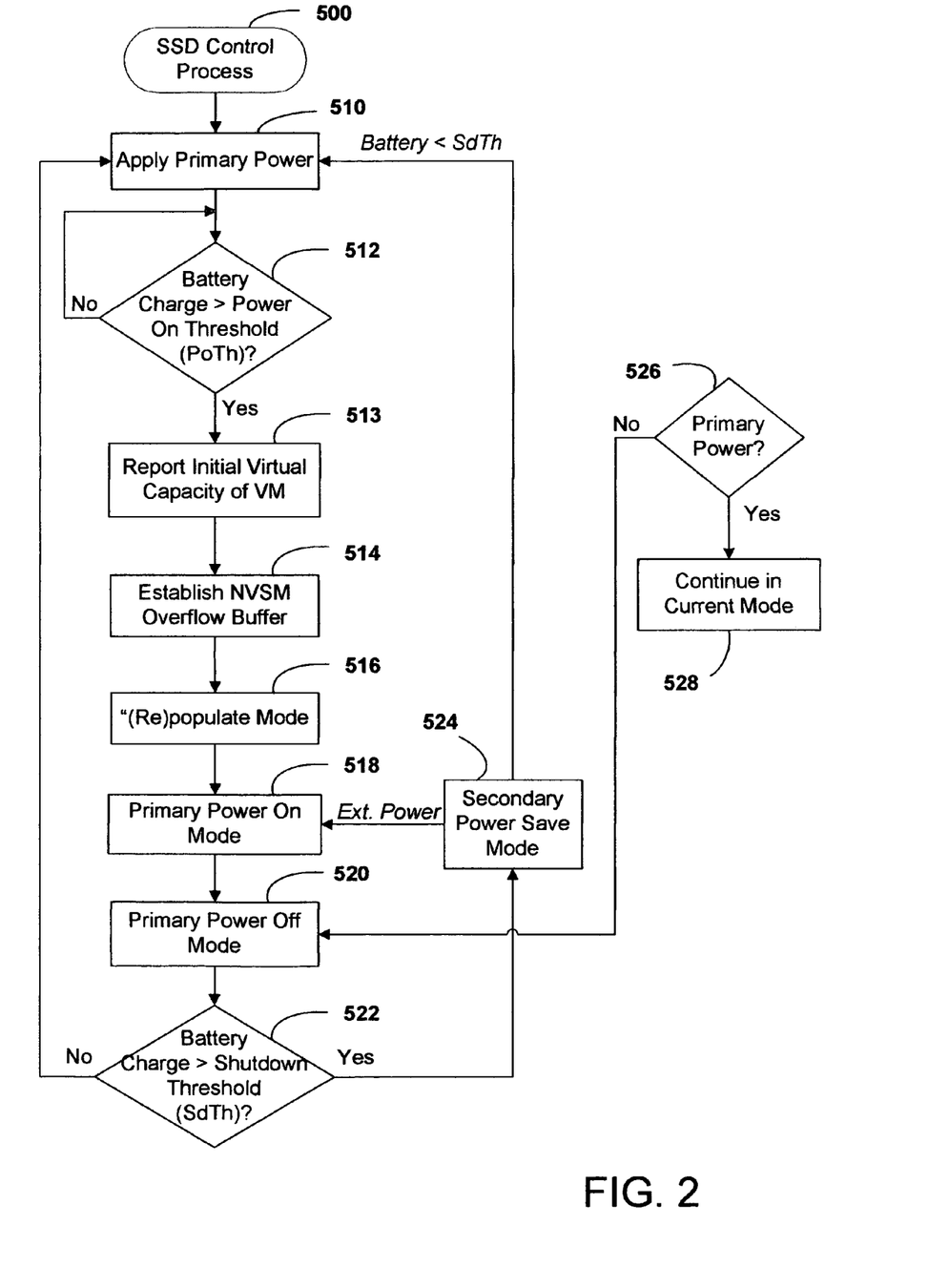
FIGS. 2-6 are process flow diagrams illustrating embodiments of the control process of the present invention.

An overview of an embodiment of the control process 500, which is executed by the control logic 230 in conjunction with the other components of the SSD 5, is illustrated by the procedural control diagram of FIG. 2. In an embodiment, the control process 500 operates in four primary modes: (Re)populate mode 516; Primary Power On mode 518; Primary Power Off mode 520; and Secondary Power Save mode 524.

In (Re)populate mode 516, the SSD controller 12 populates (in the event a new NVSM 30 is provided with pre-loaded data) or repopulates (in the event that the SSD 5 is coming back up from a shutdown due to loss of primary power) the VM 16 with data stored in or on the NVSM 30 storage medium. In an embodiment, the (Re)populate mode 516 is also used to populate any data written to an overflow buffer on the NVSM 30 storage medium to the VM 16 when sufficient virtual storage capacity of the VM 16 permits. The SSD controller 12 also processes Input/Output (I/O) requests from the host computer during the (Re)populate mode 516 so that the SSD 5 does not have to wait until the entire VM 16 has been (re)populated to begin serving the host computer.

Once (re)population of the VM 16 is complete, or in the event that the (re)population process cannot continue due to a lack of sufficient virtual capacity in the VM 16, the SSD 5 operates in Primary Power On mode 518. In this mode, the controller 12 not only handles I/O requests for the host computer, but it also steadily replicates the data stored in the VM 16 to the NVSM 30 in between servicing pending I/O transactions. Replication serves to minimize the amount of data that must be written to the NVSM 30 during a shut-down. Replication also improves reliability in that it minimizes the amount of battery power required to write the data stored in VM 16 to the NVSM 30 during a shut-down. This in turn permits the SSD 5 to use the conserved battery power (while in Secondary Power Save mode 524) to continue refreshing the VM 16 after a shut-down. If primary power can be restored while sufficient battery power exists to keep the VM 16 refreshed or powered, the boot up process including (re)population will not be necessary and the system down time is kept to a minimum. In such a case, the SSD 5 can go straight back to Primary Power On mode 518. Also during Primary Power On mode 518, SSD 5 (through control process 500) checks to see if data has been written to the overflow buffer due to a lack of sufficient virtual capacity of the VM 16 when processing write operations and whether sufficient virtual capacity has been freed up to accommodate the data in the VM 16.

Processing moves to the Primary Power Off mode 520 from the Primary Power On mode 518 when there is an interruption in the primary power supply. During this mode, the SSD controller 12 performs a shut-down process during which any data not replicated while the SSD 5 was in Primary Power On mode 518 must be written to the NVSM 30 using the secondary power source. In the case where NVSM 30 includes a magnetic disk as its storage medium, the outer portion of the disk (which is the fastest portion of the disk to access due to the higher tangential velocity of the tracks there) is reserved for the shut-down write process. This further minimizes the time necessary to save off the unreplicated data from the VM 16 to the NVSM 30 and thus further conserves the internal battery power.

In Secondary Power Save mode 524, which is entered upon completion of the shut-down process and if the battery has a charge level that meets or exceeds a shutdown threshold (SdTh), all components of controller 12 not required to maintain data in the VM 16 or to continue to monitor for the restoration of primary power and the current battery charge level can be disconnected from power to further conserve the battery power. The secondary power supplied by the internal battery is then used to refresh the VM 16 when its storage medium is DRAM, or to supply constant power if the storage medium is SRAM for example. If the primary power is restored while the internal battery still has sufficient charge to meet or exceed the shutdown threshold SdTh, the SSD 5 can return directly to the Primary Power On mode 518 without need for repopulating the VM 16 from the NVSM 30. If the battery charge level falls below SdTh, the SSD 5 ceases refreshing and/or maintaining the data stored in the VM 16 storage medium and shuts down. The controller 12 then awaits restoration of primary power at block 510. When primary power is restored, the SSD 5 proceeds to (Re)populate mode 516 once more, providing that the battery charge level at that time exceeds the predetermined primary power on battery threshold (PoTh). Otherwise the controller 12 waits until the battery charges to the PoTh before proceeding. In an embodiment, PoTh would typically be less than SdTh.

A more detailed discussion of an embodiment of the SSD control process 500 of the present invention in implementing compression is now presented with reference to FIGS. 2-5. Initially, primary power is applied to the SSD 5 at block 510. This can be subsequent to an interruption of the primary power, or it could be the first time the SSD 5 is booted up. Primary power is typically supplied from a standard external AC or DC power source but could also be supplied by a battery external to the SSD 5, such as in the case of a lap-top or notebook computer for example. At decision block 512, the secondary source of power typically provided by an internal back-up battery resident in the SSD 5 (and not shown in FIG. 1) is tested to determine if it has a charge level greater than the predetermined primary power on threshold capacity (PoTh). In an embodiment, this could be sufficient capacity to ensure that a worst case amount of unreplicated data can still be written from the VM 16 to the NVSM 30 in the event primary power is lost shortly after boot up. If the battery charge level is not at or above that threshold, the control process waits for the battery to charge to a level that meets the PoTh before proceeding to process block 513.

Once it is determined that sufficient level of charge has been reached (i.e. battery charge level is greater than the PoTh), processing continues at block 513, whereupon initialization, the SSD 5 reports to the host computer system (for example, through a storage array controller) a capacity that is based on a predetermined average compression ratio. This predetermined ratio can be one that is assigned to the SSD 5 when manufactured, or it can be programmable. The value of the ratio can be based on the average compression ratio expected for the type of data that will typically handled by the SSD 5.

At 514, an overflow buffer is established for NVSM 30. In an embodiment, the size of the overflow buffer can be fixed at the physical capacity of the VM 16 to handle the worst case scenario where the actual current compression ratio falls to 1:1. In another embodiment, the size of the overflow buffer can be variably configured contingent upon the value of the predetermined ratio. For example, the overflow buffer size can be made equal to $(n-1)C_{VM}$, F where the predetermined ratio is n:1 and $C_{VM}$=the physical capacity of the VM 16.

As will be described in more detail below, an embodiment of SSD 5 monitors and updates the actual current compression ratio and the actual currently available virtual capacity of the VM 16 in view of write operations to the VM 16. These can be write operations requested by the host, as well as write operations that result during (re)population of the VM 16 as described in detail below. In this way, the SSD 5 is aware of fluctuations in the actual compression ratio being achieved and how that affects the currently available storage capacity of the VM 16. Should the currently available virtual capacity of the VM 16 be insufficient to accommodate a write operation, data is instead written to the overflow buffer and the data is represented by entries in a overflow list 66, FIG. 1.

In an embodiment, the current compression ratio and the currently available virtual capacity of the VM 16 can also be periodically reported to the host computer system (e.g. through a storage array controller) so that if the available virtual capacity of the VM 16 falls below a first predetermined threshold level of available virtual capacity, the host (for example through a memory controller) can redirect further storage operations to other memory devices in the array, such as additional SSD units comprising the storage array or external RAID (redundant array of independent disks) storage systems. Once the available virtual capacity of the VM 16 rises above a second predetermined threshold level, the host can resume sending store requests to the SSD 5 and/or the SSD 5 can continue to populate the VM 16. In an embodiment, updated values of current compression ratio and available virtual capacity can be provided to the system subsequent to the processing of every storage request processed by the SSD 5.

Once the overflow buffer has been established at 514, processing then proceeds to (Re)populate mode 516. If primary power has been restored after an interruption of the primary supply, then the nature of the process is a repopulation of data. If the power is being applied to the SSD 5 for the first time or after insertion of a new NVSM 30 (or even a new storage medium within the NVSM 30), then the VM 16 will essentially be populated with the data for the first time. Those of skill in the art will recognize that this distinction is semantic in nature, and only distinguishes between two scenarios involving the identical process: 1) data is retrieved from the NVSM 30 and stored in the VM 16 for the first time; 2) data that was once stored in VM 16, that was either replicated to the NVSM 30 during Primary Power On mode 518 or was temporarily written to the NVSM 30 during shutdown while in Primary Power Off mode 520, and is then retrieved and stored to VM 16 once primary power has been restored; and 3) data was temporarily written to the shutdown buffer when the current virtual capacity of the VM 16 was insufficient to accommodate the storage of additional data, and is then retrieved and written to the VM 16 when the current virtual capacity is sufficient to permit it. Other than the foregoing distinction, the process connoted by the two terms is the same and thus the terms populate and repopulate may be used interchangeably herein, often as (re)populate.

During (Re)populate mode (516, FIG. 3), primary power is coupled to all of the components of the controller 12, as well as VM 16 and NVSM 30 at block 610. This occurs in the event that certain of the components of the SSD 5 and controller 12 may be decoupled from the power supply during Secondary Power Save mode 524. The controller 12 then coordinates the (re)population of the VM 16 from the NVSM 30 at block 612 based on file list information that is associated with the data stored on or in the storage media of the NVSM 30, which includes appropriate address locations for the data in the VM 16.

Figure 4:
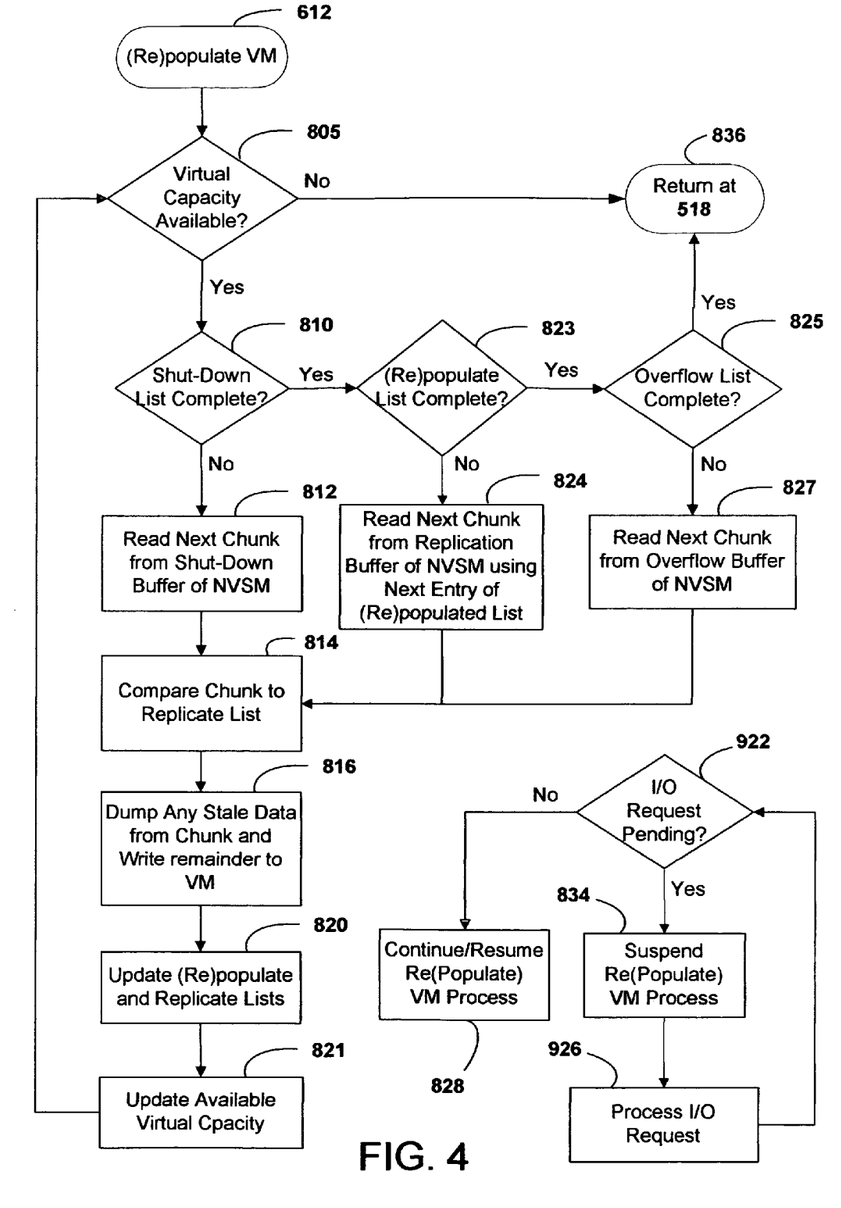

A more detailed description of an embodiment of the (Re) populate VM process 612 is illustrated in FIG. 4. In an embodiment, the NVSM 30 includes a magnetic disk as its storage medium. The disk can be partitioned into two or more areas in addition to the overflow buffer previously discussed. One can be called the shut-down buffer area and typically includes tracks at the outside of the disk, which has the greatest tangential velocity and thus is the fastest area of the disk to access. Data that is written to the shutdown buffer is represented by entries in a shutdown list 64, FIG. 1. A second area of the disk can be called the replication buffer, and this will contain data that is written to the disk during the replication process of the Primary Power On mode 518. Once again, data that is written to the replication buffer during the replication process is represented by entries in a replicate list 62, FIG. 1. In this case, the data is written to the storage medium of NVSM 30 more as it is arranged in the VM 16 because it was replicated in the presence of primary power and thus time was not of the essence. As previously mentioned, the (Re)populate VM process 612 can be called from either the (Re)populate mode 516 or from the Primary Power On mode 518, FIG. 5 for purposes of populating data written to the overflow buffer.

At decision block 805, it is first determined if there is sufficient virtual capacity in the VM 16 to store data from the NVSM 30. If the answer is No, then processing continues at block 836 where processing continues to the Primary Power On mode 518, FIG. 5, which will be discussed in more detail below. If the answer is Yes at 805, processing continues at decision block 810, where the controller 12 first determines whether any unprocessed entries of a shutdown list 64, FIG. 1 remain. As previously discussed, the shutdown list 64, FIG. 1 contains entries providing information for any data that was previously written to the shutdown buffer of the NVSM 30 during a shut-down after loss of power. This file information can include the total amount of data written to the shutdown buffer and the memory address information for purposes of (re)population of the data stored in the shutdown buffer to the proper memory locations VM 16. This shutdown list 64, FIG. 1 can also include information concerning how recently the data was accessed and/or how often it has been accessed. In an embodiment, data can be chunked and the entries of the shutdown list 64, FIG. 1 organized using this information, thereby giving priority to data that was most recently or most frequently accessed prior to the shutdown.

If the answer at 810 is No, then the next chunk of data as pointed to by the next unprocessed entry of the shutdown list 64, FIG. 1 is retrieved from the shut-down buffer area of the disk, (or of whatever other storage medium that is used in the NVSM 30). At 814 the retrieved chunk is compared to file data for that chunk stored in a list called the replicate list (62, FIG. 1) that is recorded by the core logic 230 of the controller 12. If any of the data has been overwritten by host write operations processed during the (re)populate process, the corresponding and now stale data is dropped from the chunk (so as not to overwrite more recent data for those locations) and only the data that is left is written to the VM 16 at block 816. The core logic 230 at block 820 then updates both the (re) populate list 60, FIG. 1 (to indicate that the data has been repopulated) and the replicate list 62, FIG. 1 (to indicate that this data needs to be replicated back to the replicate buffer of the NVSM 30). At block 821, the current compression ratio and currently available virtual capacity of the VM 16 is also updated. Processing then continues at 805 where again it is determined if there currently remains sufficient virtual capacity of the VM 16. If the answer is Yes, processing continues at block 810 as previously described above for each entry in the shutdown list 64, FIG. 1.

Once all of the entries of the shutdown list 64, FIG. 1 have been processed, the answer at 810 is Yes and the (re)populated list 62, FIG. 1 is consulted at 823 to determine whether all entries in this list have been processed. If the answer at 823 is No, then the (re)populate list 62, FIG. 1 contains file data entries pointing to data that was previously replicated to the replication buffer area of the storage medium of the NVSM 30 during the Primary Power On mode (518, FIG. 1). The nature of the data in this list is substantially the same as that described for the shutdown list. Accordingly, the data in the replicate buffer can be chunked and ordered by organizing entries in the (re)populate list 62, FIG. 1 in a manner that gives priority to (re)populating the replicated data that was most recently accessed, for example. The next chunk of data stored in the replication buffer that is pointed to by next unprocessed entry of the (re)populate list (re)populate list 62, FIG. 1 is retrieved at 824 and the same process previously applied to entries of the shutdown list 64, FIG. 1 and their respective chunks of data is then applied for each entry of the (re) populate list 62, FIG. 1 and their respective chunks of data at blocks 814, 816, 820, 821, and 805 to this chunk as to the chunks retrieved from the shut-down buffer area of the NVSM 30 storage medium. If the entries of the (re)populated list 62 are organized to prioritize data most recently accessed, the SSD 5 can get faster access to the data most likely to be accessed sooner by the host repopulated more quickly than the more stagnant data.

If the answer at 823 is Yes, it means all of the replicated data from the replication buffer has been repopulated back to the VM 16, and processing moves to decision block 825. If the answer at block 825 is No, it means that unprocessed entries remain in the overflow list 66, FIG. 1 corresponding to data that has been previously written to the overflow buffer. The same process as applied to data in the previous two buffers is then applied at blocks 814, 816, 820, 821, and 805 to the overflow data to effectuate population of the overflow data to the VM 16 until all entries in the overflow list 66, FIG. 1 and the answer at 825 is therefore Yes, at which time processing returns through block 836 to Primary Power On mode 518, FIG. 5. If at any time, the answer at 805 is No, processing moves from the (Re)populate VM process 612 directly to Primary Power On 518, FIG. 5 mode at block 836.

Also while the (Re)populate VM process 612 is ongoing, the controller 12 is monitoring in parallel the I/O channel for I/O requests from the host (at 922, FIG. 4). If an I/O request is received from the host and is pending, the (Re)populate VM process 612 is interrupted and suspended at 834. The controller 12 then handles the request at 926 and returns to see if any other requests are pending. If not, the (Re)populate VM process 612 resumes from wherever it was suspended until the next I/O request is received. In this way, the SSD 5 is able to handle communications with the host even before the (re) populate mode has been completed. It should be noted that the current available virtual capacity of the VM 16 must be able to accommodate any write operations received from the host. A more detailed description of the processing of I/O requests is presented later.

Figure 3:
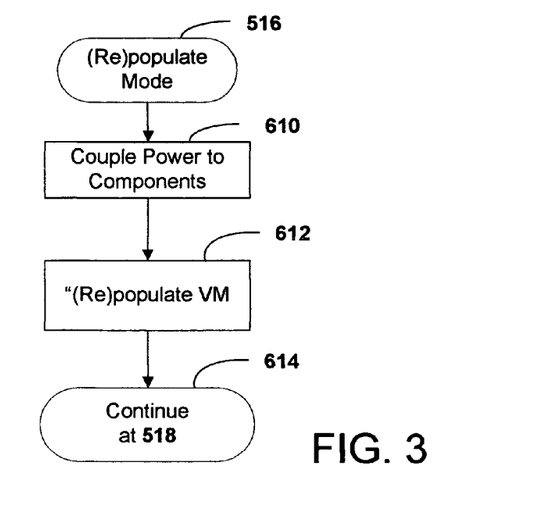
Figure 5:
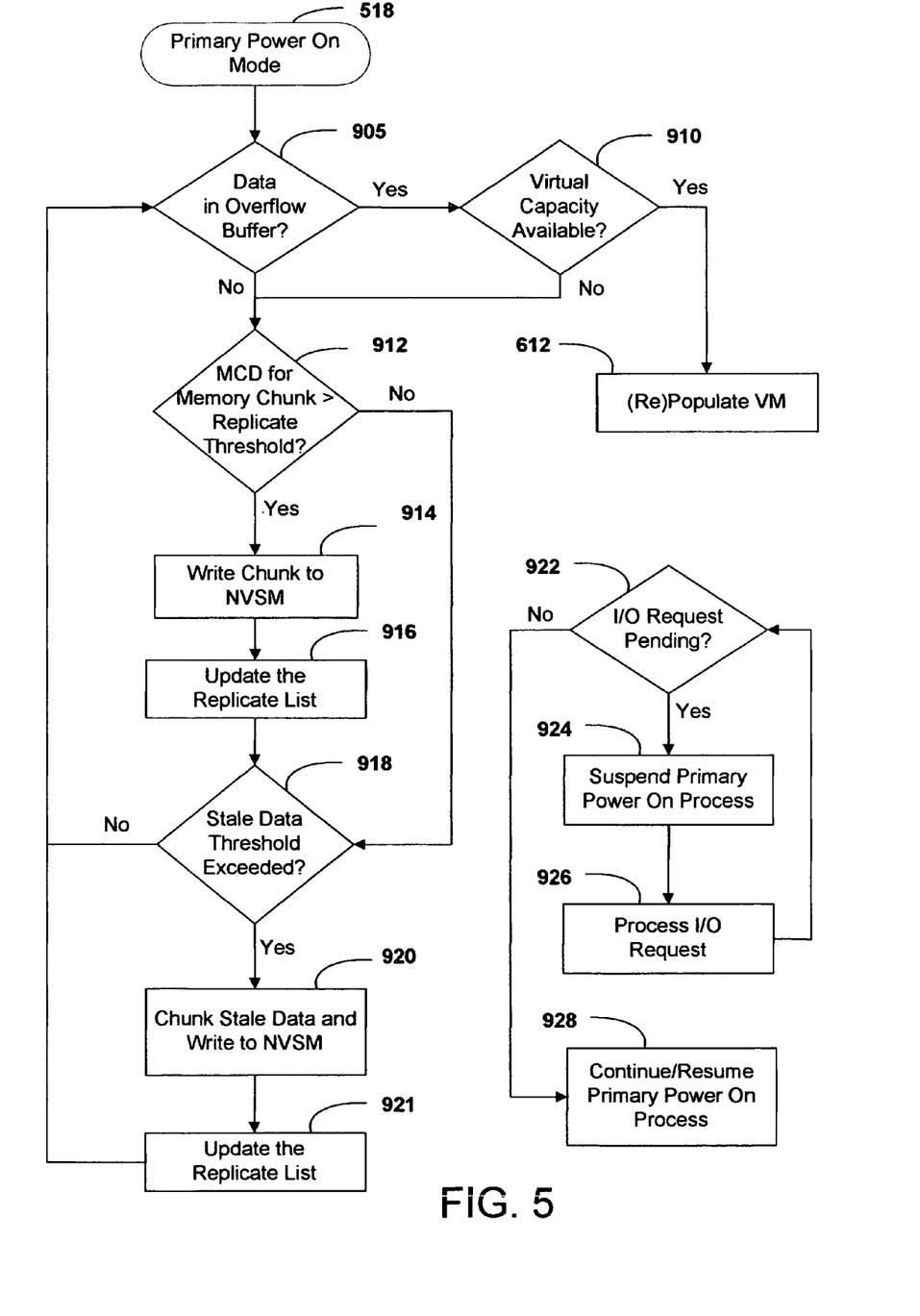

When the (Re)populate VM process 612 is complete after all shutdown buffer data, all replication buffer data and all overflow buffer data has been (re)populated, processing returns from block 836 through block 614, FIG. 3 to the Primary Power On mode 518 of FIG. 5. At block 905, the controller determines if any data has been written to the overflow buffer. If the answer is No, processing continues at block 912, but if the answer is Yes the controller 12 then determines at block 910 if sufficient virtual capacity currently exists to populate some or all of the data in the buffer to the VM 16. If the answer is Yes, the controller calls the (Re) populate VM process 612, FIG. 4 and processing proceeds as previously described If the answer is No, processing continues at block 912.

At block 912, controller 12 monitors the replicate list 62, FIG. 1, containing entries corresponding to data that has been written to the VM 16 by the host, for chunks of data that have been modified by some percentage greater than a predetermined replicate threshold percentage or by some replicate threshold given in total amount of data changed (e.g. megabytes of changed data (MCD)). For example, in an embodiment, the replicate threshold could be when 80% or more of the data in a particular chunk has been overwritten. When this percentage threshold or total data changed threshold has been met or exceeded for a chunk in the replicate list 62, FIG. 1, the answer at 912 is Yes and the chunk is then replicated (i.e. written) to the NVSM 30 at 914. The replicate list 62 is then updated at 916 to indicate that this chunk has been replicated and that the percentage of changed data for that chunk is back to zero.

The controller 12 also monitors those chunks with changed data that have not exceeded the replicate threshold over some predetermined period of time at block 918. When this time period has been exceeded, all stale chunks are written to the NVSM 30 at 920 and then the replicate list is updated as before to indicate that this data has been replicated and that the percentage of changed data for the chunk has returned to zero Those of skill in the art will recognize that the data can be re-chunked to improve the efficiency of writing the stale data in accordance with algorithms the details of which are not pertinent to the embodiments of the present invention disclosed herein. Also as previously mentioned, the optimal values for the replicate threshold, the size of the chunks and the stale data period can vary depending upon the particular application, etc. Thus the actual values used are not specific to the embodiments disclosed herein. Processing then returns to 905 determine if data has been written to the overflow buffer and if so, whether sufficient virtual capacity currently exists in the VM 16 to accommodate data from the overflow buffer. If Yes, the (Re)populate VM process is called again.

In Primary Power On mode (518, FIG. 4), the controller also monitors in parallel the receipt of I/O requests from the host at 922. When an I/O request is pending, the Primary Power On process 518 is suspended at 924 and the I/O request is processed by the controller 12 at 926. Once the request is processed, if there are no further requests pending, the Primary Power On process 518 resumes or continues from the point at which it was suspended at 928 and runs until another I/O request is received.

The processing of the I/O requests affects the replication process of the Primary Power On mode (518, FIG. 5) as well as the (Re)populate VM process (616, FIG. 4). As indicated, the Process I/O Request process 926 can be called while the SSD is in either the (Re)populate VM mode or during the replication process of the Primary Power On mode. Regardless from which mode the Process I/O call is made, the controller 12 suspends operations for whichever of the two modes in which the SSD 5 is currently operating (either block 834, FIG. 4 or block 924, FIG. 5) and proceeds to block 926, FIGS. 4 and 5, which calls the Process I/O Request process 926 as described in FIG. 6.

Figure 6:
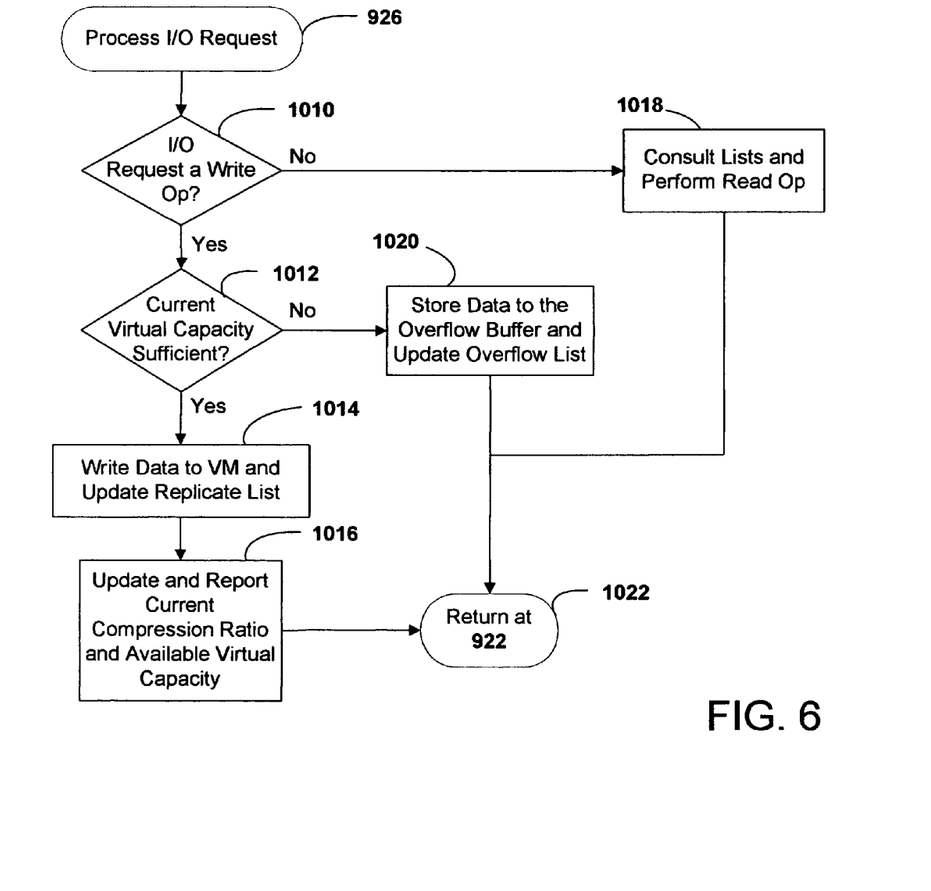

The Process I/O Request process 926, FIG. 6 determines at decision block 1010 whether the requested operation involves writing data to the VM 16. If the answer is No, the read operation is processed normally at 1018, which involves consulting the lists 60, 62, 64 and 66 to determine where (i.e. the replicate buffer, the VM 16, the shutdown buffer or the overflow buffer respectively) the data to be read is currently located, after which the process returns at 1022 to whichever of the two aforementioned modes that was suspended to handle the operation (block 922, FIG. 4 or 5). If the answer is Yes at block 1010, the controller 12 checks to see if there is sufficient virtual capacity to handle the write operation at decision block 1012. If the answer is Yes, the write operation is processed at block 1014, which includes updating the replicate list 62, FIG. 1, and at 1016 the current compression ratio and currently available virtual capacity is updated based on the transaction. Processing then returns at 1022 to whichever of the two aforementioned modes that was suspended to handle the operation (block 922, FIG. 4 or 5). If the answer at 1012 is No, the data is stored directly to the overflow buffer of the NVSM 30 at block 1020, which includes updating the overflow list 66, FIG. 1. Processing again then returns at 1022 to whichever of the two aforementioned modes that was suspended to handle the operation (block 922, FIG. 4 or 5).

Those of skill in the art will appreciate there are a number of ways in which overflow data can be handled within the context of the operation of the SSD 5. Thus, in no way is it intended that the invention be limited to the exact manner in which the overflow data is handled in the foregoing embodiments, which are by example only. Moreover, while various lists are disclosed herein as one embodiment to identify data residing in various buffers or the VM 16, those of skill in the art will recognize that a single memory table or list could also be used, wherein the current location of data for each entry may be identified with a tag.

With reference to FIG. 2, if primary power should be lost and this loss is detected at 526, processing will proceed to Primary Power Off mode 520. The I/O channel is taken off line so no further I/O requests from the host are permitted. This also helps to conserve the secondary battery power which is now being applied to the remaining controller 12 components as well as the VM 16 and NVSM 30. The next step is to chunk any data listed in the Replicate List 62 and write it to the shut-down buffer area of the NVSM 30 storage medium. In an embodiment, the storage medium is a magnetic disk and the shut-down buffer area includes the most outside tracks available on the physical disk. Once this process has been completed, processing returns to decision block 522, FIG. 2.

At this point, it is determined whether the current battery charge level is still above the predetermined shutdown threshold level (SdTh). This threshold could be, for example, the amount of battery power required to handle a worst case shut-down write of replicated data to the NVSM 30 medium plus some safety margin. If the answer is No, the SSD controller 12 shuts down and awaits the restoration of primary power at 510. If the answer is Yes at 522, processing continues at 524 where the controller enters Secondary Power Save mode 524.

Secondary Power Save mode 524 begins by decoupling all non-essential components from the internal secondary battery supply, except for example, those components necessary to refresh the VM 16 and to monitor primary power and internal battery charge level. Should primary power be restored while in Secondary Power Save mode 524, the controller components are re-coupled to the primary power supply and processing returns directly to Primary Power On mode 518. If power is not currently restored then it is determined if the battery charge level is still greater than a predetermined charge threshold. If power is restored, the VM 16 is refreshed. Controller 12 continues to monitor for the restoration of primary power and for the battery charge level to fall below the predetermined threshold. So long as the charge level of the secondary power source remains greater than the predetermined threshold, the controller continues to refresh or otherwise maintain the data stored in the media of VM 16. If the battery charge level is detected to fall below the predetermined threshold, the controller 12 ceases to refresh or otherwise maintain the data in VM 16.

Processing continues at 510, FIG. 2 where the controller 12 ceases activity except to monitor for the restoration of primary power at 510, FIG. 2. Those of skill in the art will recognize that if the VM 16 comprises storage media that does not require refreshing, but rather a steady power supply, the process described above will supply the constant supply rather than periodically refreshing the medium.

What is claimed is:

1. A method of increasing the storage capacity of a solid state disk (SSD) device through data compression, the SSD coupled to a host computer system and comprising a non-volatile storage module (NVSM) and a volatile memory (VM), said method comprising:
   associating the SSD with a predetermined compression ratio of n to 1, where n is a value greater than 1;
   reporting an initial virtual storage capacity to the host computer system that is n times the physical storage capacity of the VM;
   establishing an overflow buffer in the NVSM;
   monitoring the available virtual capacity of the VM based on the current compression ratio and the amount of data currently stored therein;
   storing data to the overflow buffer whenever the available virtual capacity falls below that necessary to successfully process a pending storage operation requested by the host computer system; and
   populating data stored in the overflow buffer to the VM when the amount of available virtual capacity of the VM can accommodate the data.

2. The method of claim 1 wherein the overflow buffer has a size that is n−1 times the physical size of the VM.

3. The method of claim 2 wherein n is substantially equal to 2 and the size of the overflow buffer is substantially equal to the physical storage capacity of the VM.

4. The method of claim 1 wherein the NVSM comprises a magnetic disk storage medium and the overflow buffer comprises tracks residing substantially at the outer portion of the magnetic disk.

5. The method of claim 1 further wherein said reporting further comprises:
   notifying the host computer system of the current compression ratio and available virtual capacity of the VM after every storage operation requested by the host computer system; and
   diverting storage operations from the SSD to an alternate storage device whenever the currently available virtual capacity falls below a first predetermined threshold.

6. The method of claim 5 further comprising resuming storage operations to the SSD when the currently available virtual capacity rises above a second predetermined threshold.

7. A method of increasing the storage capacity of a solid state disk (SSD) device through data compression, the SSD coupled to a host computer system and comprising a non-volatile storage module (NVSM) and a volatile memory (VM), said method comprising:
   associating the SSD with a predetermined compression ratio of n to 1, where n is a value greater than 1;
   monitoring the available virtual capacity of the VM based on the current compression ratio and the amount of data currently stored therein;
   reporting on a periodic basis the available virtual capacity of the VM and the current compression ratio;
   diverting storage operations from the VM of the SSD to an alternate storage device whenever the currently available virtual capacity falls below a first predetermined threshold; and
   resuming storage operations to the VM of the SSD when the currently available virtual capacity rises above a second predetermined threshold.

8. The method of claim 7 wherein the alternate storage device is the NVSM of the SSD.

9. The method of claim 7 wherein the alternate storage device is another SSD.

10. The method of claim 7 wherein the alternate storage device is a RAID (redundant array of independent disks) storage system.

11. The method of claim 7 wherein the NVSM comprises a magnetic disk storage medium, the medium configured to include an overflow buffer, said method further comprising:
   storing data to the overflow buffer whenever the available virtual capacity falls below that necessary to successfully process a pending storage operation requested by the host computer system.

12. The method of claim 11 further comprising populating data stored in the overflow buffer to the VM when the amount of available virtual capacity of the VM can accommodate the data.

13. The method of claim 7 further comprising populating data stored in the overflow buffer to the VM when the amount of available virtual capacity of the VM can accommodate the data.

14. An apparatus for increasing the storage capacity of a solid state disk (SSD) device through data compression, the SSD coupled to a host computer system and comprising a non-volatile storage module (NVSM) and a volatile memory (VM), said apparatus comprising:
   means for associating the SSD with a predetermined compression ratio of n to 1, where n is a value greater than 1;
   means for reporting an initial virtual storage capacity to the host computer system that is n times the physical storage capacity of the VM;
   means for establishing an overflow buffer in the NVSM;
   means for monitoring the available virtual capacity of the VM based on a current compression ratio and the amount of data currently stored therein;
   means for storing data to the overflow buffer whenever the available virtual capacity falls below that necessary to successfully process a pending storage operation requested by the host computer system; and
   means for populating data stored in the overflow buffer to the VM when the amount of available virtual capacity of the VM can accommodate the data.

15. The apparatus of claim 14 wherein the overflow buffer has a size that is n−1 times the physical size of the VM.

16. The apparatus of claim 15 wherein n is substantially equal to 2 and the size of the overflow buffer is substantially equal to the physical storage capacity of the VM.

17. The apparatus of claim 14 wherein the NVSM comprises a magnetic disk storage medium and the overflow buffer comprises tracks residing substantially at the outer portion of the magnetic disk.

18. The apparatus of claim 14 further wherein said means for reporting further comprises:
   means for notifying the host computer system of the current compression ratio and available virtual capacity of the VM after every storage operation requested by the host computer system; and
   means for diverting storage operations from the SSD to an alternate storage device whenever the currently available virtual capacity falls below a first predetermined threshold.

19. The apparatus of claim 18 further comprising means for resuming storage operations to the SSD when the currently available virtual capacity rises above a second predetermined threshold.

* * * * *